United States Patent
Zhao et al.

(10) Patent No.: US 10,121,725 B2
(45) Date of Patent: Nov. 6, 2018

(54) SYSTEMS FOR THERMAL MANAGEMENT AND METHODS FOR THE USE THEREOF

(71) Applicant: HENKEL IP & HOLDING GMBH, Duesseldorf (DE)

(72) Inventors: Yuan Zhao, Tustin, CA (US); Mulugeta Berhe, Union City, CA (US); Daniel Maslyk, Rancho Santa Margarita, CA (US); Scott Timon Allen, Stanton, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 15/811,185

(22) Filed: Nov. 13, 2017

(65) Prior Publication Data

US 2018/0068924 A1 Mar. 8, 2018

Related U.S. Application Data

(63) Continuation of application No. PCT/US2016/034618, filed on May 27, 2016.
(Continued)

(51) Int. Cl.
*H01L 23/10* (2006.01)
*H01L 23/34* (2006.01)
(Continued)

(52) U.S. Cl.
CPC .... *H01L 23/3736* (2013.01); *H01L 21/02112* (2013.01); *H01L 23/427* (2013.01)

(58) Field of Classification Search
CPC ............... H01L 23/372; H01L 23/427; H01L 2225/06589; H01L 21/56
(Continued)

(56) References Cited

U.S. PATENT DOCUMENTS

| 6,037,032 A | 3/2000 | Klett et al. |
| 6,097,602 A | 8/2000 | Witchger |

(Continued)

FOREIGN PATENT DOCUMENTS

| CN | 102827587 A | 12/2012 |
| RU | 2129246 C1 | 4/1999 |
| WO | 2013172994 A1 | 11/2013 |

OTHER PUBLICATIONS

Satas, D. "Handbook of Pressure Sensitive Adhesive Technology", van Nostrand, NY (1989).
(Continued)

*Primary Examiner* — S. V. Clark
(74) *Attorney, Agent, or Firm* — Taylor M. Coon

(57) ABSTRACT

In accordance with the present invention, there are provided heat dispersing articles, assemblies containing same, methods for the preparation thereof, and various uses therefor. In one aspect of the present invention, there are provided heat dispersing articles. In another aspect of the present invention, there are provided methods for producing the above-referenced articles. In yet another aspect of the present invention, there are provided assemblies containing the above-referenced articles. In still another aspect of the present invention, there are provided methods for making the above-referenced assemblies. In yet another aspect, there are provided methods to dissipate the heat generated by portable electronic devices.

18 Claims, 2 Drawing Sheets

Related U.S. Application Data

(60) Provisional application No. 62/168,141, filed on May 29, 2015.

(51) Int. Cl.
  *H01L 23/373* (2006.01)
  *H01L 21/02* (2006.01)
  *H01L 23/427* (2006.01)

(58) Field of Classification Search
  USPC .......................... 257/706, 782, 787; 438/122
  See application file for complete search history.

(56) References Cited

U.S. PATENT DOCUMENTS

| | | | |
|---|---|---|---|
| 6,523,608 | B1 | 2/2003 | Solbrekken et al. |
| 6,621,702 | B2 | 9/2003 | Elias et al. |
| 6,888,722 | B2 | 5/2005 | Viswanath |
| 6,994,155 | B2 * | 2/2006 | Dessiatoun ............... F28D 7/00 165/165 |
| 7,106,777 | B2 | 9/2006 | Delgado, Jr. et al. |
| 7,141,310 | B2 | 11/2006 | Adams et al. |
| 7,960,019 | B2 | 6/2011 | Jayaraman et al. |
| 9,936,608 | B2 * | 4/2018 | Soupremanien ... H05K 7/20336 |
| 2004/0154784 | A1 | 8/2004 | Pause |
| 2011/0083431 | A1 | 4/2011 | Mankame et al. |
| 2014/0268579 | A1 | 9/2014 | Nguyen et al. |
| 2017/0064869 | A1 * | 3/2017 | Siahaan .................. B23P 15/26 |
| 2017/0266609 | A1 * | 9/2017 | Rebouillat ............... B32B 7/02 |

OTHER PUBLICATIONS

Akhilesh, R., Narasimhan, A., and Balaji, C. "Method to improve geometry for heat transfer enhancement in PCM composite heat sinks." International Journal of Heat and Mass Transfer, 48, 2005, pp. 2759-2770.

Sari, A. and Karaipekli, A. "Thermal conductivity and latent heat thermal energy storage characteristics of paraffin/expanded graphite composite as phase change material." Applied Thermal Engineering, 27, 2007, pp. 1271-1277.

Alawadhi, E. M. and Amon, C. H. "PCM thermal control unit for portable electronic devices: experimental and numerical studies." IEEE Trans. Components Packaging Technology, 26, pp. 116-125.

Kle, J. "Thermal Management of the Future" Carbon Materials Technology Group Materials Science and Technology Division, Oak Ridge National Lab.

* cited by examiner

SYSTEMS FOR THERMAL MANAGEMENT AND METHODS FOR THE USE THEREOF

FIELD OF THE INVENTION

The present invention relates to heat dispersing articles, assemblies containing same, methods for the preparation thereof, and various uses therefor. In one aspect, the invention relates to heat dispersing articles. In another aspect, the invention relates to methods for producing articles according to the present invention. In yet another aspect, the invention relates to assemblies containing invention articles. In still another aspect, the invention relates to methods for making invention assemblies. In yet another aspect, the invention relates to methods to dissipate the heat generated by electronic devices such as portable electronic devices.

BACKGROUND OF THE INVENTION

Electronic devices, especially portable electronic devices (e.g., smart phones, iPods, tablets, hand-held medical devices, gaming systems, and the like) have now become part of our daily lives. As the demand for speed and additional functionalities rapidly expands, the heat generated by such devices increases dramatically. However, due to the small surface area available for heat to dissipate, such devices tend to get more and more thermally limited.

Active cooling is generally not appropriate for such devices, e.g., due to space limitations, concerns with the reliability of the cooling device, the noise generated thereby, etc. As one possible solution, the use of phase change materials (PCM's) has been proposed. Basically, a PCM with reasonably high latency is used, such that the PCM melts within a temperature range capable of managing some of the excess power produced during periods of heavy use; the resulting melted PCM can re-solidify during periods of low use, which can thereby provide a boost to performance on demand.

Unfortunately, conventional PCM's (e.g., waxes, oils, and the like) typically have very low thermal conductivity (about 0.2 W/mK); hence, such materials tend to function as thermal insulators. Because of the size and volume limitations of portable electronic devices, PCM's are typically placed directly inside the heat transfer passage, and share space with other packaging/heat spreading components, which creates a serious dilemma in thermal management design. In addition, in order to achieve the advantages of PCM-based thermal solutions, the PCM must be able to quickly absorb heat throughout its entire volume, which requires that the PCM have a high thermal conductivity.

Due to the limitations referred to above, there are, at present, no practical PCM-based thermal solutions for electronic devices such as portable electronic devices.

SUMMARY OF THE INVENTION

In accordance with the present invention, there are provided heat dispersing articles, assemblies containing same, methods for the preparation thereof, and various uses therefor. In one aspect of the present invention, there are provided heat dispersing articles. In another aspect of the present invention, there are provided methods for producing the above-referenced articles. In yet another aspect of the present invention, there are provided assemblies containing the above-referenced articles. In still another aspect of the present invention, there are provided methods for making the above-referenced assemblies. In yet another aspect, there are provided methods to dissipate the heat generated by portable electronic devices.

Invention articles comprise a thermally conductive, low-profile structure(s), impregnated with a phase change material (PCM), wherein said thermally conductive, low-profile structure(s) is sandwiched between a first and a second conductive/protective layer.

DETAILED DESCRIPTION OF THE INVENTION

Figure 1:
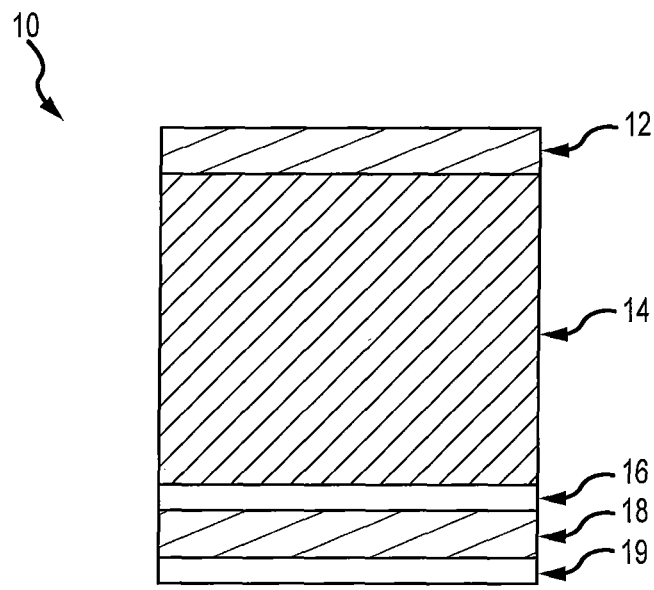
FIG. 1 is an exemplary first article (10) according to the present invention, said article comprising:
- a first conductive/protective layer (12) (i.e., "25 µm Cu"),
- at least one layer (14) (having a thickness of about 100 µm up to about 200 µm) of a porous thermally conductive, low-profile structure(s), impregnated with a sufficient quantity of a formulated phase change material (PCM) so as to substantially cover the surface and voids of said porous thermally conductive, low-profile structure (i.e., "150 µm Mesh+PCM"; this layer can be a single layer or a stack-up of a plurality of mesh layers, wherein each of the mesh layers is impregnated with a sufficient quantity of a formulated PCM so as to substantially cover the surface and voids thereof),
- a first pressure sensitive adhesive layer (16) (i.e., "10 µm psa/epsa"),
- a second conductive/protective layer (18) (i.e., "25 µm Cu"), and
- a second pressure sensitive adhesive layer (19) (i.e., "10 µm psa/epsa").
Figure 2:
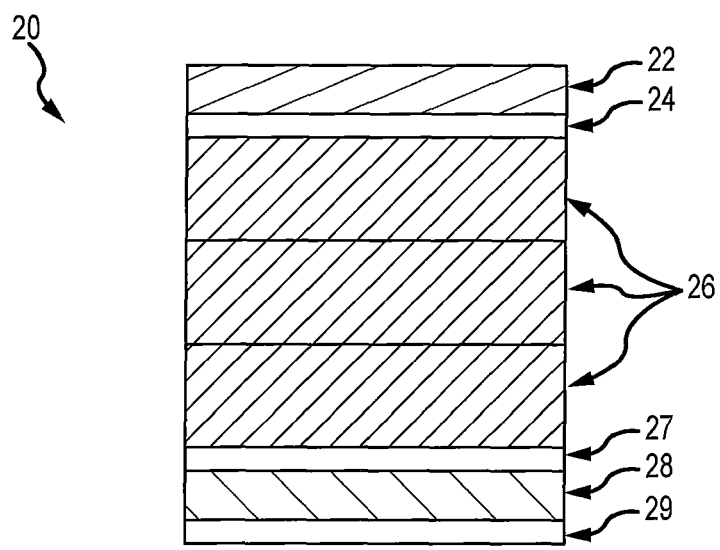
FIG. 2 shows a second exemplary article (20) according to the present invention, said article comprising:
- a first conductive/protective layer (22) (i.e., "25 µm Cu"),
- a first pressure sensitive adhesive layer (24) (i.e., "10 µm epsa"),
- three layers (26) of a porous thermally conductive, low-profile structure(s), wherein each layer is impregnated with a sufficient quantity of a formulated phase change material (PCM) so as to substantially cover the surface and voids of said porous thermally conductive, low-profile structure (i.e., 3×"50 µm Mesh+PCMI"),
- a second pressure sensitive adhesive layer (27) (i.e., "10 µm psa/epsa"),
- a second conductive/protective layer (28) (i.e., "25 µm Graphite"), and
- a third pressure sensitive adhesive layer (29) (i.e., "10 µm psa/epsa").
Figure 3:
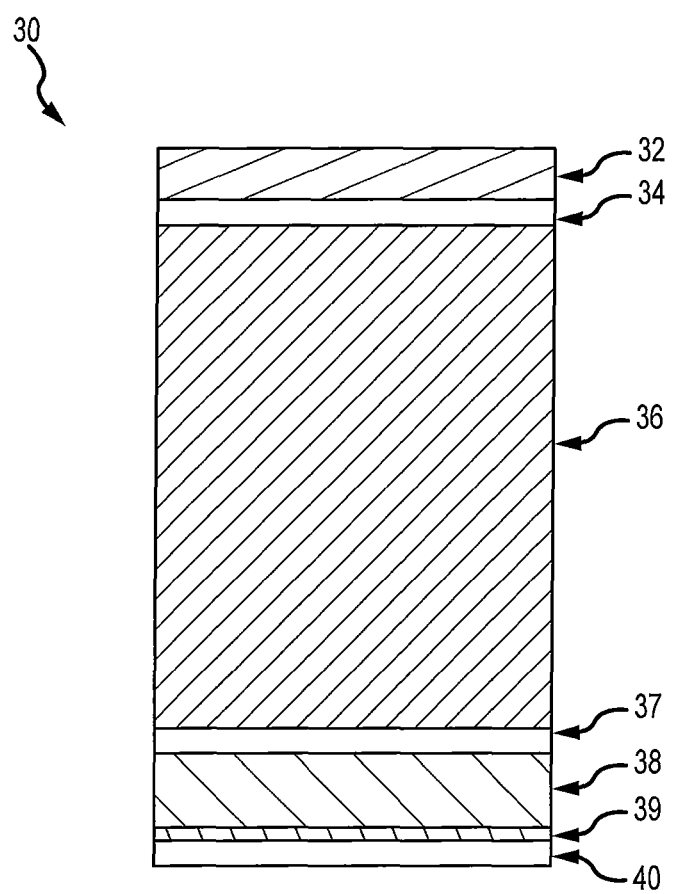
FIG. 3 shows a third exemplary article (30) according to the present invention, said article comprising:
- a first conductive/protective layer (32) (i.e., "25 µm Cu"),
- a first pressure sensitive adhesive layer (34) (i.e., "10 µm psa"),
- a porous thermally conductive, low-profile structure (36), impregnated with a sufficient quantity of a formulated phase change material (PCM) so as to substantially cover the surface and voids thereof (i.e., "225 µm Mesh with PCM"),
- a second pressure sensitive adhesive layer (37) (i.e., "10 µm psa/epsa"),
- a second conductive/protective layer (38) (i.e., "40 µm Graphite"),
- a support layer (39) (i.e., "5 µm PET"), and
- a third pressure sensitive adhesive layer (40) (i.e., "10 µm psa/epsa").

In accordance with the present invention, there are provided heat-dispersing articles comprising:
a first conductive/protective layer,
one or more porous thermally conductive, low-profile structure(s), impregnated with a sufficient quantity of a formulated phase change material (PCM) so as to substantially cover the surface and voids of said porous thermally conductive, low-profile structure,
   wherein said formulated PCM comprises said PCM containing 5-20% by weight of a gelling agent mixed with said PCM, and
a second conductive/protective layer,
   wherein said one or more porous thermally conductive, low-profile structure(s) are sandwiched between said first and second conductive/protective layers, and
   wherein said article has:
      a latency of at least 100 J/cc, and
      an effective thermal conductivity of at least 10 W/mK.

A variety of conductive/protective layers are contemplated for use herein. Exemplary conductive/protective layers include copper foil, copper mesh (e.g., expanded or woven mesh), copper cloth (e.g., expanded or woven cloth), copper foam, aluminum foil, aluminum mesh (e.g., expanded or woven mesh), aluminum cloth (e.g., expanded or woven cloth), aluminum foam, graphite sheet, and the like.

Exemplary foil materials contemplated for use herein as a conductive/protective layer(s) include materials having a thickness in the range of about 10 μm up to about 200 μm; exemplary mesh/cloth materials contemplated for use herein as a conductive/protective layer(s) include materials having a mesh size in the range of about 60 wires/in, up to about 200 wires/in; exemplary foam materials contemplated for use herein as a conductive/protective layer(s) include porous structures or open-celled foam consisting of an interconnected network of solid struts; like soap suds or beer foam, the original bubbles that form the foam are a three-dimensional, perfectly packed array of similar sized bubbles where each bubble has the maximum volume for the minimal surface area and surface energy; and exemplary sheet materials contemplated for use herein as a conductive/protective layer(s) include materials having a pore size in the range of about 20 pores/in$^2$ up to about 40 pores/in$^2$ and a relative density in the range of about 3% up to 12%.

A variety of porous thermally conductive, low-profile structures can be employed in the practice of the present invention, for example, copper mesh, copper cloth, copper foam, aluminum mesh, aluminum cloth, aluminum foam, and the like.

The porous thermally conductive, low-profile structures contemplated for use herein typically have a thickness in the range of about 50 μm up to about 1 mm. In some embodiments, the thickness of the porous thermally conductive, low-profile structures falls in the range of 150-200 μm.

Porous thermally conductive, low-profile structures contemplated for use herein may be further characterized with reference to the "area opening ratio" and/or the "volumetric opening ratio" thereof. As used herein, "area opening ratio" refers to the percentage of the surface of the porous thermally conductive, low-profile structure that is receptive to wetting with a phase change material; relative to the surface of the porous thermally conductive, low-profile structure that is not receptive to wetting with a phase change material.

Similarly, "volumetric opening ratio" refers to the portion of the interior volume of the porous thermally conductive, low-profile structure that is receptive to wetting with a phase change material, relative to the portion of the interior volume of the porous thermally conductive, low-profile structure that is not receptive to wetting with a phase change material.

Porous thermally conductive, low-profile structures contemplated for use herein typically have area opening ratios in the range of about 40% up to about 70%; and volumetric opening ratios in the range of about 60% up to about 95%. In some embodiments, porous thermally conductive, low-profile structures contemplated for use herein typically have an area opening ratio in the range of about 50% up to about 60%; in some embodiments, porous thermally conductive, low-profile structures contemplated for use herein typically have an area opening ratio of about 60%. In some embodiments, porous thermally conductive, low-profile structures contemplated for use herein typically have a volumetric opening ratio in the range of about 70% up to about 85%; in some embodiments, porous thermally conductive, low-profile structures contemplated for use herein typically have an area opening ratio of about 85%.

Exemplary mesh/cloth materials contemplated for use herein can be characterized as expanded or woven meshes; and exemplary foam materials contemplated for use herein can be characterized as open cell, low density foams.

In some embodiments, the porous thermally conductive, low-profile structures contemplated for use herein comprise a wire mesh with an area opening ratio in the range of about 30% up to about 60%.

Formulated PCM's contemplated for use herein can be prepared by mixing 5%-20% by weight of a gelling agent with a phase change material. In some embodiments, formulated PCM's can be prepared by mixing 10% by weight of a gelling agent with a phase change material.

Exemplary phase change materials contemplated for use herein include:
   paraffins having the formula: $C_nH_{2n+2}$, wherein n falls in the range of about 20 up to 40,
   fatty acids having the formula: $CH_3(CH_2)_{2n}COOH$ with similar melting temperature range,
   and the like, as well as
   mixtures of any two or more thereof.

In some embodiments, the phase change material has a melting temperature that is no more than about 20° C. below the final equilibrium temperature of the native environment in which a portable electronic device is employed. In some embodiments, the phase change material has a melting temperature that is no more than about 15° C. below the final equilibrium temperature of the native environment in which a portable electronic device is employed. In some embodiments, the phase change material has a melting temperature that is no more than about 10° C. below the final equilibrium temperature of the native environment in which a portable electronic device is employed.

Exemplary gelling agents contemplated for use herein include polymeric wax gellants, block co-polymer gellants, high surface area inorganic pigments/fillers (e.g., montmorillonite, diatomite, expanded/exfoliated graphite), form stable paraffin/HDPE (high density polyethylene) composites, and the like.

Exemplary block co-polymer gellants contemplated for use herein include JSR (JSR Corporation) Dynaron 6360B (an olefin crystalline-ethyene,butylene-olefin crystalline block copolymer (CEBC) or a crystalline block-(ethylene/butylene)-crystalline block copolymer (CEBC), Kraton SBS (styrene-butylene-styrene block copolymers), Kraton SEBS (styrene-ethylene/butylene-styrene block copolymers), and the like.

In some embodiments, the formulated PCM of invention articles is substantially uniformly gelled throughout the thickness of the porous thermally conductive, low-profile structure(s).

The thickness of the formulated PCM employed to impregnate the porous thermally conductive, low-profile structures is typically 1-2 times the thickness of the porous thermally conductive, low-profile structure.

Optionally, PCM's employed in the practice of the present invention can be encapsulated. One way in which such encapsulation can be achieved is by:
- impregnating said porous thermally conductive, low-profile structure with said formulated PCM, and then
- laminating said impregnated porous thermally conductive, low-profile structure with a heat conducting sheet through a pressure sensitive adhesive (PSA) layer, which prevents the PCM from leaking out.

Heat conducting sheets contemplated for use in this embodiment of the invention typically have a thickness in the range of 25 µm to 500 µm.

Alternatively, when the heat conducting sheet is a graphite sheet, such constructs typically have a thickness in the range of 25 µm to 70 µm.

In order for invention articles to be effective for the dissipation of heat from portable electronic devices, such articles will typically have a latency of at least 100 J/cc. In some embodiments, invention articles will have a latency of at least 240 J/cc.

Invention articles can be further defined with respect to the effective thermal conductivity thereof. In some embodiments, the thermal conductivity is at least 10 W/mK. In some embodiments, the thermal conductivity is >50 W/mK.

In accordance with another embodiment of the present invention, there are provided heat-dispersing assemblies comprising:
- 5 µm to 20 µm thickness of a first pressure sensitive adhesive layer,
- a conductive base layer having a thickness in the range of about 17 µm to 500 µm;
- 25 µm to 150 µm of a porous thermally conductive, low-profile structure(s) according to the present invention,
- 5 µm to 10 µm thickness of a second pressure sensitive adhesive layer,
- 25 µm to 50 µm thickness of a thermal conductive/protective layer, and
- 5 µm to 10 µm thickness of an electrical insulation layer.

Pressure sensitive adhesive layers contemplated for use herein include elastomers (e.g., an acrylate) compounded with a suitable tackifier (e.g., a rosin ester), and the like. PSAs can be made from acrylic polymers, such as those having the following composition or those that can be prepared by polymerizing:
(i) an acrylic monomer which is an acrylic or methacrylic acid derivative (e.g. methacrylic acid ester) of the formula:

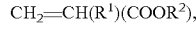

where:
R$^1$ is H or CH$_3$ and
R$^2$ is a C$_{1-20}$, preferably C$_{1-8}$, alkyl chain and
(ii) a monomer with a pendant reactive functional group, which is described in more detail herein below, and the amount of the monomer (ii) is from about 0.001 to about 0.015 equivalent per 100 g of the acrylic polymer.

For the polymerization process, the monomers of components (i) and (ii), where appropriate, are converted by radical polymerization into acrylic polymers. The monomers are chosen such that the resulting polymers can be used to prepare PSAs in accordance with D. Satas, "Handbook of Pressure Sensitive Adhesive Technology", van Nostrand, N.Y. (1989).

Examples of acrylates and/or methacrylates useful as components of monomer mixture (i) include methyl acrylate, ethyl acrylate, ethyl methacrylate, methyl methacrylate, n-butyl acrylate, n-butyl methacrylate, n-pentyl acrylate, n-hexyl acrylate, n-heptyl acrylate, and n-octyl acrylate, n-nonyl acrylate, lauryl methacrylate, cyclohexyl acrylate, and branched (meth)acrylic isomers, such as i-butyl acrylate, i-butyl methacrylate, n-butyl methacrylate, 2-ethylhexyl acrylate, stearyl methacrylate, and isooctyl acrylate.

An exemplary acrylic monomer mixture (i) has a Tg value less than 0° C. and a weight average molecular weight from about 10,000 to about 2,000,000 g/mol, such as between 50,000 and 1,000,000 g/mol and desirably between 100,000 and 700,000 g/mol. The mixture (i) may be a single monomer provided that it has a homopolymer Tg of less than 0° C.

Examples of suitable monomers (ii) are those capable of providing green strength to the adhesive films, include cycloaliphatic epoxide monomers M100 and A400 (Daicel), oxetane monomer OXE-10 (available commercially from Kowa Company), dicyclopentadienyl methacrylate epoxide (CD535, available commercially from Sartomer Co., Exton, Pa.), and 4-vinyl-1-cyclohexene-1,2-epoxide (available commercially from Dow).

Acrylic polymers are capable of undergoing post-UV cationic activated reaction and thus, provide high temperature holding strength to the adhesive films. Exemplary acrylic polymers are those having the following composition or those that can be prepared by polymerizing:
(i) an acrylic monomer which is an acrylic or methacrylic acid derivative of the formula:

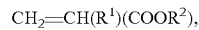

where
R$^1$ is H or CH$_3$ and
R$^2$ is C$_{1-20}$ alkyl chain and
(ii) a monomer with a combination of pendant reactive functional groups selected from both (1) cycloaliphatic epoxide, oxetane, benzophenone or mixtures thereof, and (2) mono-substituted oxirane.

The amount of monomer (ii) is about 0.001 to about 0.015 equivalent per 100 g of the acrylic polymer. The acrylic polymer is essentially free of multi-(meth)acrylate, polyol or OH-functional groups and the polymer remains substantially linear after polymerization. In certain embodiments, the amount of the monomer (ii) is from about 0.002 to about 0.01 equivalent per 100 g of the acrylic polymer.

Acrylic polymers prepared generally have a weight average molecular weight (Mw) of from 10,000 to 2,000,000 g/mol, such as between 50,000 and 1,000,000 g/mol, like between 100,000 and 700,000 g/mol. Mw is determined by gel permeation chromatography or matrix-assisted laser desorption/ionization mass spectrometry.

Examples of mono-substituted oxiranes useful as monomer (ii) include glycidyl methacrylate, 1,2-epoxy-5-hexene, 4-hydroxybutylacrylate glycidyl ether, cycloaliphatic epoxide monomer M100 and A400, OXE-10, CD535 epoxide, and 4-vinyl-1-cyclohexene-1,2-epoxide.

PSAs may also comprise various other additives, such as plasticizers, tackifiers, and fillers, all of which are conventionally used in the preparation of PSAs. As plasticizers to be added, low molecular weight acrylic polymers, phthalates, benzoates, adipates, or plasticizer resins, are but a few possibilities. As tackifier or tackifying resins to be added, it is possible to use any known tackifying resins described in the literature. Non-limiting examples include pinene resins, indene resins, and their disproportionated, hydrogenated, polymerized, and esterified derivatives and salts, the aliphatic and aromatic hydrocarbon resins, terpene resins, terpene-phenolic resins, C5 resins, C9 resins, and other hydrocarbon resins. Any desired combinations of these or other resins may be used in order to adjust the properties of the resultant adhesive in accordance with the desired final properties.

PSAs may further be blended with one or more additives such as aging inhibitors, antioxidants, light stabilizers, compounding agents, and/or accelerators.

Thermally conductive base layers contemplated for use herein include copper foil, copper mesh, copper cloth, copper foam, aluminum foil, aluminum mesh, aluminum cloth, aluminum foam, and the like.

In accordance with yet another embodiment of the present invention, there are provided methods to prepare the above-described assemblies, said method comprising:
(i) stacking and laminating:
   a first pressure sensitive adhesive layer,
   a thermal conductive base layer,
   a first article comprising a thermally conductive, low-profile structure, impregnated with formulated phase change material (PCM),
   a second pressure sensitive adhesive layer,
   a protective layer, and/or
   an electrical insulating layer, and
(ii) applying sufficient force and temperature to the resulting stack to obtain a stably-adhered assembly.

In accordance with another embodiment of the present invention, there are provided heat-dispersing assemblies comprising:
   5 µm to 20 µm thickness of a first pressure sensitive adhesive layer,
   a conductive base layer having a thickness in the range of about 17 µm to 500 µm;
   25 µm to 150 µm of a first porous thermally conductive, low-profile structure(s) according to the present invention,
   5 µm to 10 µm thickness of a second pressure sensitive adhesive layer,
   25 µm to 150 µm of a second porous thermally conductive, low-profile structure(s) according to the present invention,
   25 µm to 50 µm thickness of a thermal conductive/protective layer, and
   5 µm to 10 µm thickness of an electrical insulation layer.

In accordance with still another embodiment of the present invention, there are provided methods to prepare the above-described assemblies, said method comprising:
(i) stacking and laminating:
   a first pressure sensitive adhesive layer,
   a thermal conductive base layer,
   a first article comprising a thermally conductive, low-profile structure, impregnated with formulated phase change material (PCM),
   a second pressure sensitive adhesive layer,
   a second article comprising a thermally conductive, low-profile structure, impregnated with formulated phase change material (PCM),
   a protective layer, and/or
   an electrical insulating layer, and
(ii) applying sufficient force and temperature to the resulting stack to obtain a stably-adhered assembly.

In accordance with another embodiment of the present invention, there are provided heat-dispersing assemblies comprising:
   5 µm to 20 µm thickness of a first pressure sensitive adhesive layer,
   a conductive base layer having a thickness in the range of about 17 µm to 500 µm;
   25 µm to 150 µm of a first porous thermally conductive, low-profile structure(s) according to the present invention,
   5 µm to 10 µm thickness of a second pressure sensitive adhesive layer,
   25 µm to 150 µm of a second porous thermally conductive, low-profile structure(s) according to the present invention,
   5 µm to 10 µm thickness of a third pressure sensitive adhesive layer,
   25 µm to 150 µm of a third porous thermally conductive, low-profile structure(s) according to the present invention,
   25 µm to 50 µm thickness of a thermal conductive/protective layer, and
   5 µm to 10 µm thickness of an electrical insulation layer.

In accordance with still another embodiment of the present invention, there are provided methods to prepare the above-described assemblies, said methods comprising:
(i) stacking and laminating:
   a first pressure sensitive adhesive layer,
   a thermal conductive base layer,
   a first article comprising a thermally conductive, low-profile structure, impregnated with formulated phase change material (PCM),
   a second pressure sensitive adhesive layer,
   a second article comprising a thermally conductive, low-profile structure, impregnated with formulated phase change material (PCM),
   a third pressure sensitive adhesive layer,
   a third article comprising a thermally conductive, low-profile structure, impregnated with formulated phase change material (PCM),
   a protective layer, and/or
   an electrical insulating layer, and
(ii) applying sufficient force and temperature to the resulting stack to obtain a stably-adhered assembly.

In accordance with yet another embodiment of the present invention, there are provided methods to prepare articles as described herein, said methods comprising impregnating a porous thermally conductive, low-profile structure with a sufficient quantity of a molten form of a formulated phase change material (PCM) so as to substantially wet the porous thermally conductive, low-profile structure.

In some embodiments, the formulated phase change material comprises PCM containing in the range of about 5-20% by weight of a gelling agent mixed with said PCM.

In accordance with yet another embodiment of the present invention, there are provided methods for dissipating the heat generated by compact electronic devices, said method comprising contacting said device with an article as described herein.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

Example 1

The performance properties of a PCM-based thermal system according to the present invention was compared to that of conventional thermal management system with comparable heat spreading capability, but no PCM.

The results demonstrate that the PCM-based system significantly lowers junction temperature during the transit period, presumably due to the thermal storage effect of the PCM.

Example 2

An exemplary PCM-based thermal system according to the present invention was compared with two conventional PCM-based solutions having PCM's with a much lower melting temperature (such that the PCM's thereof released their latency within a very low temperature range).

The results demonstrate that invention heat-dissipating articles are superior to conventional PCM-based solutions for the removal of heat generated by portable electronic devices.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A heat-dispersing article comprising:
a first conductive/protective layer,
one or more porous thermally conductive, low-profile structure(s), impregnated with a sufficient quantity of a formulated phase change material (PCM) so as to substantially cover the surface and voids of said porous thermally conductive, low-profile structure,
wherein said formulated PCM comprises said PCM containing 5-20% by weight of a gelling agent mixed with said PCM, and
a second conductive/protective layer,
wherein said one or more porous thermally conductive, low-profile structure(s) are sandwiched between said first and second conductive/protective layers, and
wherein said article has:
a latency of at least 100 J/cc, and
an effective thermal conductivity of at least 10 W/mK.

2. The article of claim 1 wherein said porous thermally conductive, low-profile structure comprises a copper mesh, a copper cloth, a copper foam, an aluminum mesh, an aluminum cloth, or an aluminum foam.

3. The article of claim 2 wherein the porous thermally conductive, low-profile structure is a wire mesh.

4. The article of claim 2, wherein the thickness of the porous thermally conductive, low-profile structure falls in the range of about 50 µm up to about 1 mm.

5. The article of claim 2 wherein the thickness of the formulated PCM is 1-2 times the thickness of the porous thermally conductive, low-profile structure.

6. The article of claim 1 wherein said porous thermally conductive, low-profile structure has an area opening ratio in the range of about 40% up to about 70%, and a volumetric opening ratio in the range of about 60% up to about 95%.

7. The article of claim 1 wherein said formulated PCM is prepared by mixing 5%-20% by weight of a gelling agent with a phase change material selected from:
a paraffin ($C_nH_{2n+2}$), wherein n falls in the range of about 20 up to 40, or
a fatty acid ($CH_3(CH_2)_{2n}COOH$) with similar melting temperature range, or
mixtures of any two or more thereof.

8. The article of claim 7 wherein said formulated PCM is substantially uniformly gelled throughout the thickness of said porous thermally conductive, low-profile structure(s).

9. The article of claim 1 wherein said PCM is encapsulated.

10. The article of claim 9 wherein:
said porous thermally conductive, low-profile structure is impregnated with said formulated PCM, and then
said impregnated porous thermally conductive, low-profile structure is laminated with a heat conducting sheet through a pressure sensitive adhesive (PSA) layer, which prevents the PCM from leaking out.

11. The article of claim 10 wherein said heat conducting sheet is a copper foil, a copper mesh, a copper cloth, a copper foam, an aluminum foil, an aluminum mesh, an aluminum cloth, an aluminum foam, or a graphite sheet.

12. The article of claim 11 wherein said heat conducting sheet has a thickness in the range of 25 µm to 500 µm.

13. The article of claim 11 wherein said heat conducting sheet is a graphite sheet having a thickness in the range of 25 µm to 70 µm.

14. A heat-dispersing assembly comprising:
5 µm to 20 µm thickness of a first pressure sensitive adhesive layer,
a conductive base layer having a thickness in the range of about 17 µm to 500 µm;
25 µm to 150 µm of a porous thermally conductive, low-profile structure(s), impregnated with a sufficient quantity of a formulated phase change material (PCM),
5 µm to 10 µm thickness of a second pressure sensitive adhesive layer,
25 µm to 50 µm thickness of a thermal conductive/protective layer, and
5 µm to 10 µm thickness of an electrical insulation layer.

15. A heat-dispersing assembly comprising:
5 µm to 20 µm thickness of a first pressure sensitive adhesive layer,
a conductive base layer having a thickness in the range of about 17 µm to 500 µm;
25 µm to 150 µm of a first porous thermally conductive, low-profile structure(s), impregnated with a sufficient quantity of a formulated phase change material (PCM), 5 µm to 10 µm thickness of a second pressure sensitive adhesive layer, 25 µm to 150 µm of a second porous thermally conductive, low-profile structure(s), impregnated with a sufficient quantity of a formulated phase change material (PCM), 25 µm to 50 µm thickness of a thermal conductive/protective layer, and 5 µm to 10 µm thickness of an electrical insulation layer.

16. A heat-dispersing assembly comprising:

5 µm to 20 µm thickness of a first pressure sensitive adhesive layer, a conductive base layer having a thickness in the range of about 17 µm to 500 µm;

25 µm to 150 µm of a first porous thermally conductive, low-profile structure(s), impregnated with a sufficient quantity of a formulated phase change material (PCM), 5 µm to 10 µm thickness of a second pressure sensitive adhesive layer, 25 µm to 150 µm of a second porous thermally conductive, low-profile structure(s), impregnated with a sufficient quantity of a formulated phase change material (PCM), 5 µm to 10 µm thickness of a third pressure sensitive adhesive layer, 25 µm to 150 µm of a third porous thermally conductive, low-profile structure(s), impregnated with a sufficient quantity of a formulated phase change material (PCM), 25 µm to 50 µm thickness of a thermal conductive/protective layer, and 5 µm to 10 µm thickness of an electrical insulation layer.

17. A method to prepare an article according to claim 1, said method comprising impregnating a porous thermally conductive, low-profile structure with a sufficient quantity of a molten form of a formulated phase change material (PCM) so as to substantially wet the porous thermally conductive, low-profile structure.

18. The method of claim 17 wherein said formulated phase change material comprises said PCM containing 5-20% by weight of a gelling agent mixed with said PCM.

* * * * *